United States Patent [19]
Fitzgerald et al.

[11] Patent Number: 5,160,277
[45] Date of Patent: Nov. 3, 1992

[54] SNAP-IN LAMP FOR PRINTED CIRCUITS

[75] Inventors: James J. Fitzgerald, Boontown, N.J.; Marvin L. Owen, Grand Blanc, Mich.

[73] Assignee: Cooper Industries, Inc., Houston, Tex.

[21] Appl. No.: 504,467

[22] Filed: Apr. 4, 1990

[51] Int. Cl.$^5$ ............................................. H01R 13/73
[52] U.S. Cl. ........................................ 439/554; 439/56
[58] Field of Search ................... 439/56, 57, 617, 619, 439/375, 379, 526, 546, 547, 548, 549, 554, 558

[56] References Cited

U.S. PATENT DOCUMENTS

| | | | |
|---|---|---|---|
| 2,884,609 | 4/1959 | Fraser et al. | 439/57 |
| 4,029,953 | 6/1977 | Natoli | 439/546 |
| 4,152,622 | 5/1979 | Fitzgerald | 439/56 |
| 4,227,760 | 10/1980 | Witek | 439/547 |
| 4,820,956 | 4/1989 | Slobodzian et al. | 439/56 |

FOREIGN PATENT DOCUMENTS 1372384  10/1974  United Kingdom .................. 439/56

Primary Examiner—David L. Pirlot
Attorney, Agent, or Firm—Ned L. Conley

[57] ABSTRACT

A lamp assembly includes a lamp socket adapted for receiving a lamp. The lamp socket has a rectangular subbase which includes at least one tang projecting upwardly from the subbase which is adapted to apply an outward force against the inner sides of the circular section of a hole in a circuit board or panel. The tang has at least one downwardly facing shoulder spaced upwardly from the upper surface of the subbase by a distance which is substantially the thickness of the circuit board or panel whereby the shoulder is moved to allow the insertion of the lamp assembly into the hole of the circuit board or panel and then moved back into position to hold the circuit board or panel under the shoulder upon the circuit board or panel engaging the subbase. Thus, the lamp assembly can be locked into position within the hole in the printed circuit board or panel without rotation, and then removed by rotating the lamp assembly.

25 Claims, 2 Drawing Sheets

SNAP-IN LAMP FOR PRINTED CIRCUITS

FIELD OF THE INVENTION

The invention relates to a lamp socket which can be snapped into a printed circuit board or a flexible circuit on a mounting panel without rotating the socket to lock it into place, and then can be removed by rotating the socket.

BACKGROUND OF THE INVENTION

Lamp assemblies are often installed in printed circuits. They are particularly useful in printed circuit boards used for automotive instrument panels, where the lamps provide the light needed to read the instruments and warning telltales. The lamp assembly typically includes a socket and lamp and is designed to install into the instrument panel from the rear and then remain fixed in position.

The difficulty with the "mass production" installation of lamp assemblies into printed circuits is that the conventional lamp socket must be pushed into position in the panel and then rotated to lock the socket onto the panel. Because it is necessary to rotate the lamp socket after insertion, it is more difficult to fully automate the assembly procedure, in that more complex machinery and more time is required to perform the rotation step. Therefore, a lamp socket which does not have to be rotated in order to lock it into place is very desirable in that it reduces assembly time and cost.

SUMMARY OF THE INVENTION

The present invention is a lamp assembly which includes a socket for accommodating a lamp. When the lamp assembly is inserted into a hole in a printed circuit, the lamp assembly snaps into the hole and need not be rotated after insertion in order to lock it into place. The hole in the printed circuit has a circular section and two opposed slots extending outwardly from the perimeter of the circular section, giving it a bow-tie shape when seen in a plan view.

The lamp socket includes a subbase having an upper annular flange. The preferred lamp base has two opposed pairs of tangs extending from the upper surface of the annular flange. Two of the opposed tangs include lips that have tapered upper surfaces terminating in a downwardly facing shoulder. The tangs are bent slightly inwardly for insertion into the hole in the printed circuit, and then press outwardly against the circular section of the hole to inhibit rotational movement of the lamp assembly following insertion. Two opposed nubs on the upper surface of the subbase may also aid in inhibiting rotation of the lamp assembly. The subbase is wider than the circular section of the hole, thereby preventing upward movement of the lamp assembly once it is in place.

To install the lamp assembly, the ends of the tangs are aligned with the slots in the printed circuit. As it is inserted into the hole, the edges of the hole engage the tapered upper surfaces of the tangs causing the tangs to cam inwardly. Upon the circuit board or panel engaging the subbase, the tangs are allowed to move to their normal position as the edge of the circuit board or panel is received between the shoulder and the surface of the subbase.

To remove the assembly from the circuit board or panel, the lamp base is rotated, causing the tangs to deform radially inwardly as they slide under the circular section of the hole. Once the horizontal lips are aligned with the slots of the hole, the assembly is removed from the rear of the circuit board or panel.

Other objects and advantages of the invention will appear from the following description.

BRIEF DESCRIPTION OF THE DRAWINGS

For a detailed description of a preferred embodiment of the invention, reference will now be made to the accompanying drawings wherein.

DETAILED DESCRIPTION OF THE PREFERRED EMBODIMENTS

Figure 1:
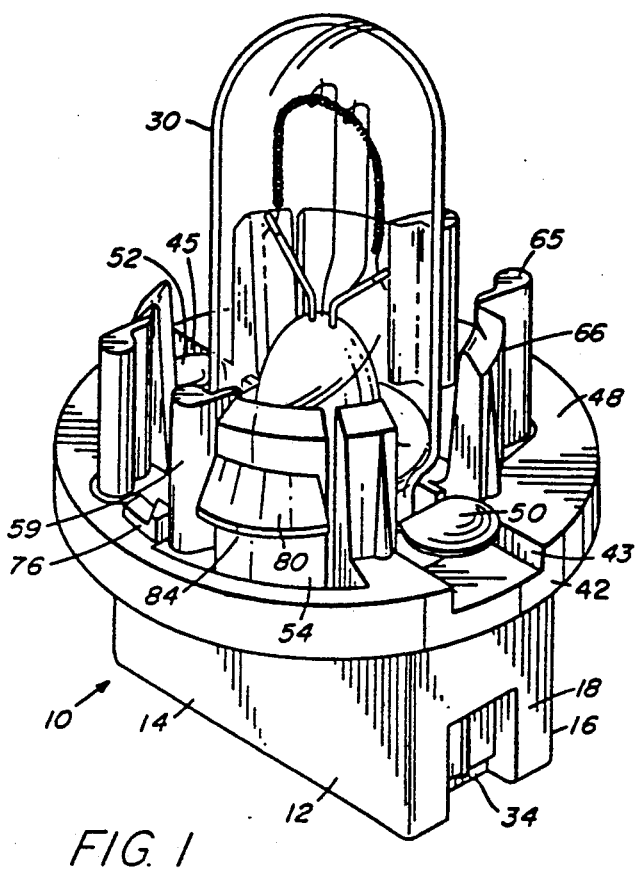
FIG. 1 is an isometric view of the preferred lamp socket of the invention with a bulb inserted.
Figure 2:
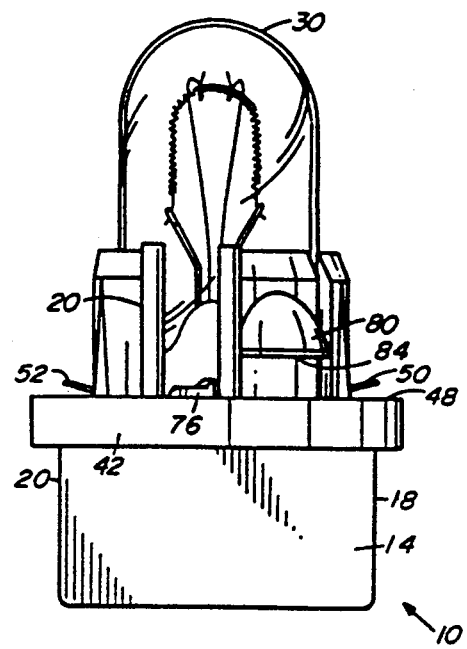
FIG. 2 is a side elevational view of the lamp assembly of FIG. 1.
Figure 3:
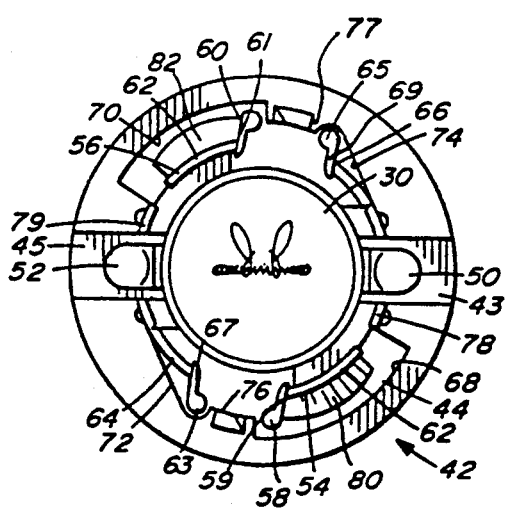
FIG. 3 is a top plan view of the lamp assembly of FIG. 1.
Figure 4:
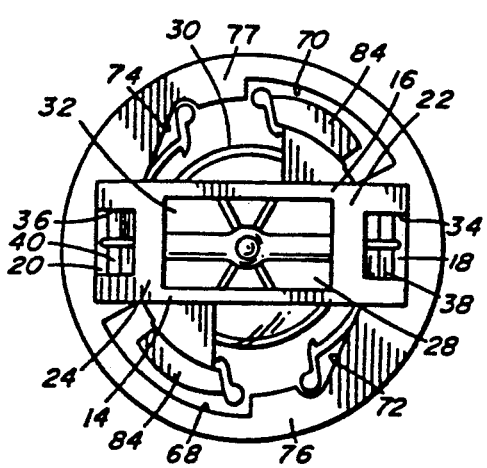
FIG. 4 is a bottom plan view of the lamp assembly of FIG. 1.

Referring initially to FIGS. 1, 2 and 4, the preferred lamp assembly of the present invention is shown having a socket 10 and lamp 30. Lamp socket 10 includes a rectangular subbase 12 formed by opposed parallel rectangular sides 14, 16, opposed ends 18, 20, and two bottom braces 22, 24. Lamp socket 10 is made of plastic, preferably a polymer. A window 32 is formed through the bottom of subbase 12 between braces 22, 24. Sides 14, 16 and ends 18, 20 form a rectangular shaped receptacle 28 for receiving the lower part of lamp 30. Receptacle 28 preferably has squared inner sides to receive and hold lamp 30 in place. The gaps between braces 22, 24 and opposed ends 18, 20 form L-shaped slots 34, 36.

The lamp socket 10 further includes at the upper end of subbase 12, an annular flange 42 projecting outwardly around the upper perimeter of subbase 12. Opposed notches 43, 45 are provided on the upper surface 48 of annular flange 42. Annular flange 42 includes a central aperture 44 for receiving lamp 30. Aperture 44 extends into the center of receptacle 28, substantially from the top of subbase 12 through to the bottom. Lower support braces 22, 24, extend transversely across the bottom of subbase 12 at the bottom of receptacle 28.

The lamp 30 includes contacts 38, 40 which extend from the bottom of lamp 30 and are bent upwardly along the sides of the lamp 30. When the lamp 30 is in receptacle 28, the contacts are exposed by L-shaped slots 34, 36 and extend upwardly along the insides of ends 18, 20 of receptacle 28 with contact pads 50, 52 on the terminal ends of contacts 38, 40 projecting radially outward and protruding through notches 43, 45. The pads of contacts 50, 52 rest in notches 43, 45. Contacts 38, 40 are each designed to press against ribbon contacts, e.g., contacts 8, 9, on the underside of the circuit board or flexible circuit and provide an electrical connection after lamp assembly has been installed in the circuit board or panel.

The lamp socket 10 also includes two opposed pairs of tangs 54, 56 and 64, 66 which extend upwardly from the upper surface 48 of annular flange 42. Tangs 54, 56 include upwardly projecting posts 58, 60 attached to upwardly and outwardly projecting arcuate flanges 59, 61, respectively. Post 58 and arcuate flange 59 extend in one arcuate direction and post 60 and flange 61 extend in the other arcuate direction. Likewise, tangs 64, 66 have posts 63, 65 and arcuate flanges 67, 69. Annular flange 42 further includes opposed arcuate slots 68, 70 adjacent the perimeter of annular flange 42 and opposed base slots 72, 74 adjacent the upper end of subbase 12. Arcuate slots 68, 70 have an overlapping opening separated only by opposed lock pads 76, 77. Central aperture 44 includes a portion of arcuate slots 68, 70 and base slots 72, 74. Further, located between tang 54 and notch 43 and between tang 56 and notch 45 are projecting fingers 78, 79, respectively, extending upwardly from the upper surface 48 of annular flange 42. The inner surfaces of fingers 78, 79 are contoured so that they surround the outer surface of lamp 30 when it is installed in receptacle 28.

The body portions of opposed tangs 54, 56 each have outwardly tapered horizontal lips 80, 82. Lips 80, 82 have a tapered upper surface which terminates at a downwardly facing shoulder 84. The distance between the shoulder 84 of lips 80, 82 and the upper surface 48 of annular flange 42 is approximately the thickness of a circuit board or panel with flexible circuit for installation purposes as hereinafter described.

Figure 5:
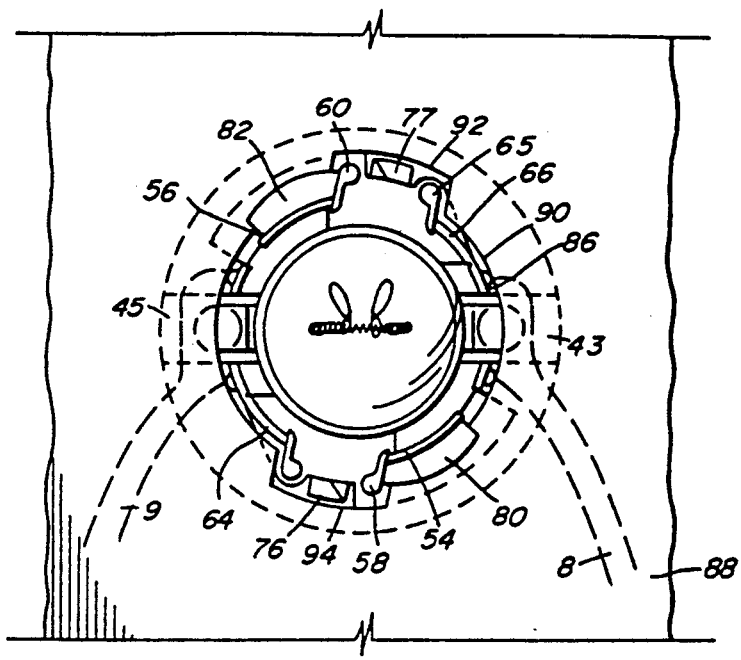
FIG. 5 is a top plan view of the lamp socket of FIG. 1 with a lamp inserted and mounted on a printed circuit or panel.

Referring now to FIG. 5, there is shown a lamp assembly installed onto a circuit board or panel 88. Circuit board or panel 88 includes a bow-tie shaped hole 86 with a circular central portion 90 having two opposed slots 92, 94 projecting radially outwardly from the circular portion 90.

To install the lamp assembly of the present invention onto circuit board or panel 88, lock pads 76, 77 and adjacent posts 58, 60 and 65, 63 of tangs 54, 56 and 64, 66, respectively, are aligned and inserted into opposed slots 92, 94 in circuit board 88. The vertical posts 58, 60 of tangs 54, 56 and 65, 63 of tangs 66, 64, which are attached to the arcuate portions of the tangs, extend at an obtuse angle from the tangs and thus project radially outwardly with respect to the hole 86 in circuit board or panel 88. Lips 80, 82 are not in alignment with opposed slots 92, 94 in hole 86, but instead, rest above the circular portion 90 of hole 86 as shown in FIG. 5. In this normal installed position, lips 80, 82 are about ⅛ of a revolution away from the opposed arcuate slots 92, 94 in annular flange 42 and contacts 50, 52 are aligned with and connect with appropriate ribbon contacts 96 on the circuit board or panel 88.

As the lamp assembly is inserted into the hole 86 of circuit board or panel 88, the inner peripheral edge of circular portion 90 engages the upper tapered surface of lips 80, 82. Further insertion deflects lips 80, 82 and thus tangs 54 and 56 inward until the surface of circuit board or panel 88 engages the upper surface 48 of annular flange 42. The dimension of shoulder 84 then allows the inner peripheral edge of circular portion 90 to be received between shoulders 84 and the upper surface 48 of annular flange 42 so as to permit lips 80, 82 and thus tangs 54 and 56 to move back outwardly to their normal position. In this manner, the lamp assembly becomes locked into place onto circuit board 88. This assembly allows the lamp socket 10 to be inserted into the bow-tie shaped hole 86 in a printed circuit board or panel 88 as shown in FIG. 5 and locked into place without rotating the lamp assembly. Lock pads 76, 77 rest in slots 92, 94 of circuit board or panel 88 when the lamp socket 10 is inserted into the hole 86.

Further, upwardly projecting tangs 54, 56 act in combination with tangs 64, 66 to bear and press against the inner peripheral edge of circular portion 90 of hole 86 when the lamp socket 10 is installed and in position. The elasticity of the material from which tangs 54, 56 and 64, 66 are made, preferably a polymer, causes tangs 54, 56 and 64, 66 to exert an outward force on the inner peripheral edge of circular portion 90 of hole 86, which thereby impedes rotation of lamp socket 10 relative to circuit board or panel 88.

One of the functions of slots 68, 70 and 72, 74 is to allow tangs 54, 56 and 64, 66 to swing inward toward central aperture 44 as the lamp assembly is inserted into hole 86 of circuit board or panel 88. Tangs 54, 56 and 64, 66 are only attached to the annular flange 42 at their lower corners so that tangs 54, 56 and 64, 66 can readily deform inwardly during insertion of the lamp assembly into hole 86.

To remove the lamp assembly from the circuit board or panel 88, the lamp socket 10 is rotated counterclockwise (as viewed in FIG. 4) until the lips 80, 82 are in alignment with opposed slots 92, 94 of hole 86. As the lamp socket 10 is rotated, lock pads 76, 77 move from their position in slots 92, 94, pass and under the surface of circuit board or panel 88, in order to prevent accidental "twist-out" of lamp socket 10. Once lips 80, 82 are aligned, the shoulders 84 of lips 80, 82 no longer engage the surface of circuit board or panel 88 and thus the circuit board or panel 88 can move away from the upper surface 48 of annular flange 42 to release the lamp socket 10.

Figure 6:
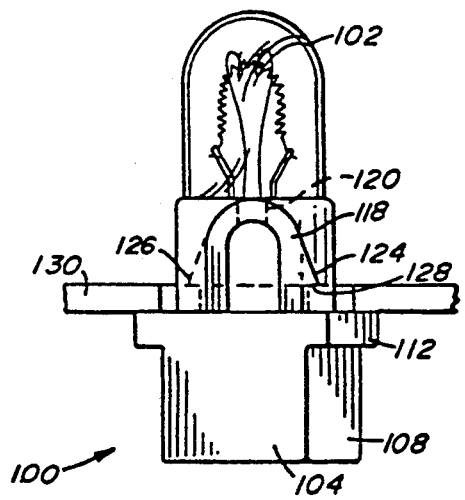
FIG. 6 is a side elevational view of another embodiment of a lamp assembly.
Figure 7:
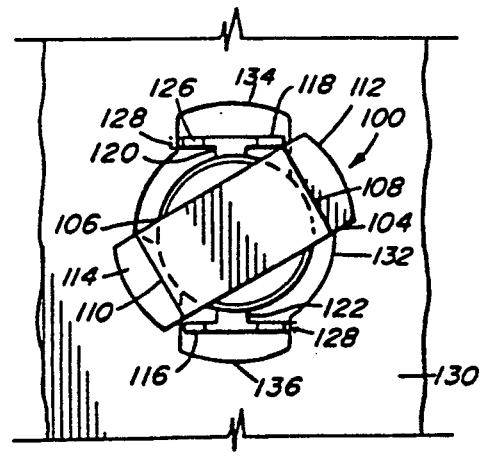
FIG. 7 is a bottom plan view of the lamp assembly of FIG. 6.

Referring now to FIGS. 6 and 7, there is illustrated another embodiment of the present invention showing another method of locking a lamp assembly to a bow-tie shaped hole in a circuit board or panel. The lamp assembly of the alternative embodiment includes a lamp socket 100 and a lamp 102. Lamp socket 100 is similar to lamp socket 10 of the preferred embodiment except that for the means for locking lamp socket 100 in the hole of a circuit board or panel. The lamp socket 100 is rectangular with opposed parallel sides 104, 106 and opposed ends 108, 110, but does not have an annular flange 42. Instead lamp socket 100 has ears 112, 114 projecting outwardly in opposite directions from ends 108, 110 of lamp socket 100. Ears 112, 114 are rectangular in cross-section and project outwardly from the upper surface of lamp socket 100 in a substantially horizontal manner.

Lamp socket 100 further includes two upwardly projecting, substantially U-shaped tangs 116, 118, respectively, disposed in inverted position on opposed portions of the upper perimeter of socket 100. Mounting sections 120, 122 extend between the inner surface of tangs 116, 118, respectively, to the upper periphery of lamp socket 100 to affix the tangs 116, 118 to socket 100. Tangs 116, 118 extend slightly outwardly from socket 100 due to the spacing provided by mounting sections 120, 122.

The right hand side of each tang 116, 118 has a tapered ramp 124, 126, respectively, which is wider at the bottom than the top. Each ramp 124, 126 forms a downwardly facing shoulder 128 having a distance above the upper surface of lamp socket 100 slightly greater than the thickness of the circuit board or panel 130. Ramp 124 is disposed on the side of tang 116 so that it is opposed to the side of tang 118 on which ramp 126 is disposed.

The circuit board or panel 130 includes a circular central hole 132 with opposed slots 134, 136.

Upon the installation of the lamp assembly into the circuit board or panel 130, tangs 116, 118 are aligned with opposed slots 134, 136 and then are inserted into slots 134, 136. The lamp assembly is inserted with the inner edge of slots 134, 136 deflecting ramps 124, 126 until the circuit board or panel 130 rests on the upper surface of ears 112, 114. Following insertion, however, the elasticity of the tang material, preferably a polymer, forces the tangs 116, 118 outwardly, so that the tangs 116, 118 rest in the slots 134, 136, as shown in FIG. 7. When the lamp assembly is in place on the circuit board or panel 130, the tangs 116, 118 extend into the slots 134, 136 of hole 132, and the ramps 124, 126 extend out from the slots 134, 136 and over the upper surface of circuit board or panel 130. Vertical movement of socket 100 is prevented, because the shoulders 128 of ramps 124, 126 abut the upper side of the circuit board or panel 130, and the ears 112, 114 abut the lower side. The contact between the outer sides of the tangs 116, 118 and the inner sides of the slots 134, 136 of hole 132 impedes rotational movement of lamp socket 100. When socket 100 is inserted in position in hole 132, the contacts (not shown) which rest on the upper surface of the ears 116, 118 connect with a ribbon contact (not shown) on the circuit board or panel 130. The ears 116, 118 are about ⅛ of a turn away from the slots, as shown in FIG. 7.

To disassemble the lamp assembly from the circuit board or panel 130, the lamp socket is rotated in the counterclockwise direction (as viewed in FIG. 7) and tangs 116, 118 bend inwardly under the circular portion of hole 132 and towards socket 100 during rotation of socket 100. Thus, the lamp socket 100 of the alternative embodiment can also be snapped into the bow-tie shaped hole 132 in circuit board or panel 130, need not be rotated to lock it into place, and can be removed by rotating the lamp socket.

The steps of inserting and removing the various embodiments of the snap-in lamp base are similar in that both sockets 10, 100, are inserted by pushing the socket through the circuit board or panel from behind. The sockets are designed such that all portions are in the proper position when the ribbon contacts are aligned so as to connect them with the contacts in the board. To remove sockets 10, 100, they are rotated until either lips 80, 82 are aligned above the slots 92, 94 respectively or the edges of one opposed side of each of tangs 116, 118 bend under the circular portion of hole 132 to allow ramps 116, 118 to become positioned over the slots 134, 136 of hole 132. The sockets are then removed by pulling them through the back of the circuit board or panel.

It can be seen that many modifications and variations of the socket and circuit board or panel design are possible and are within the scope of the invention. The foregoing descriptions are exemplary only and not limiting, the scope of protection being limited only by the claims which follow and including all equivalents of the subject matter of the following claims.

What is claimed is:

1. An assembly for receiving a lamp to mount the lamp onto a printed circuit board or panel having an aperture with opposed arcuate sections and opposed slots, comprising:

a socket having an aperture for receiving the lamp and having a support surface for engaging one side of the circuit board or panel;

at least one member projecting from said support surface and being deflectable between a deflected position and a normal position, said member having a shoulder which is substantially parallel to said support surface, the distance between said shoulder and said support surface being greater than the thickness of the circuit board or panel upon mounting the lamp onto the circuit board or panel;

said shoulder having an unaligned position for receiving an edge of an arcuate section of the circuit board or panel between said shoulder and said support surface thereby mounting said socket onto the circuit board or panel and an aligned position for releasing the edge of the arcuate section of the circuit board or panel to allow removal of said socket from the circuit board or panel;

alignment means disposed on said socket and receivable within the slots for aligning said socket with the aperture in said unaligned position;

said unaligned position of said shoulder being achieved by moving said member first to said deflected position upon the insertion of said socket into the aperture of the circuit board or panel and then to said normal position after said member has been inserted, said aligned position being achieved by the rotation of said socket within the aperture of the circuit board or panel until said member is aligned with one of the opposed slots.

2. The assembly of claim 2 wherein said member further includes an outwardly and downwardly tapered cam surface adapted to engage the inner periphery of the arcuate section in the printed circuit board or panel to apply a force to said member and cause said member and shoulder to move inwardly to said deflected position and allow the insertion of said socket into the hole of the circuit board or panel.

3. The assembly of claim 1 further including a lock pad on said support surface of said socket for preventing said socket from accidentally rotating within the aperture of said circuit board or panel.

4. The assembly of claim 1 wherein said socket is substantially parallelpiped in shape and has an annular flange which projects substantially horizontally from the upper edge of said socket.

5. The assembly of claim 1 further including notches in said support surface for housing the electrical contacts of the lamp upon mounting said socket in the circuit board or panel.

6. The assembly of claim 1 wherein said alignment means includes two pairs of first and second posts projecting perpendicularly to said support surface whereby a pair of said first and second posts is received within one of the opposed slots.

7. The assembly of claim 6 wherein there are two members having said shoulder and said first post is disposed on said member having said shoulder, said second posts being attached to said support surface at one corner to allow said second posts to deflect upon engagement of said second posts with the edge of the arcuate section of the circuit board or panel during rotation of said socket for removal.

8. The assembly of claim 6 wherein said posts and members are positioned to surround the perimeter of the lamp.

9. A lamp socket which can be locked into position in a circuit board or panel without rotation, the circuit board on panel having a bow-tie shaped hole with a slotted portion and an arcuate portion for receiving the lamp socket, the slotted portion having two sides and an end, comprising:
- a lower section adapted for receiving a lamp and having a support means for supporting the underside of the circuit board or panel;
- at least one substantially horizontal lip means for engaging one side of the slotted portion and the upper side of the circuit board or panel, said lip means adapted for passing through the slotted portion of the hole in the circuit board or panel when properly aligned to allow the lamp socket to be removed from the circuit board or panel; and
- alignment means for engaging the sides of the slotted portion to align said lip means with the arcuate portion and to inhibit rotation of the lamp socket.

10. The lamp socket of claim 9 wherein said alignment means includes at least one outwardly projecting portion disposed on an upwardly extending arcuate flange.

11. The lamp socket of claim 9 wherein said alignment means includes at least one lock pad disposed on said lower section.

12. The lamp socket of claim 9 wherein said alignment means further includes two opposed arcuate flanges each having an outwardly projecting portion disposed thereon.

13. The lamp socket of claim 9 wherein the lower section is substantially parallelpiped in shape.

14. The lamp socket of claim 9 wherein said lip means is disposed on an arcuate flange extending perpendicularly to said support means.

15. The lamp socket of claim 14 wherein said lip means includes two opposed arcuate flanges each having a shoulder facing said support means.

16. The lamp socket of claim 9 wherein the support means includes a rounded flange disposed at said lower section.

17. The lamp socket of claim 16 wherein contacts for a lamp adapted to be held in the lamp socket are disposed on said rounded flange.

18. An assembly for receiving a lamp for mounting the lamp onto a circuit board having a hole with opposed slotted portions and opposed arcuate portions, comprising:
- a base having an aperture for receiving the lamp;
- a flange on said base extending radially from said aperture and having a surface adapted for engaging the circuit board;
- opposed first tangs on said flange adjacent said aperture and projecting from said surface, said first tangs having a lip projecting radially outward with a shoulder facing said surface;
- opposed second tangs on said flange adjacent said aperture and said first tangs and projecting from said surface, said second tangs being attached to said flange so as to allow said second tangs to deform radially inward;
- said first and second tangs having adjacent free sides on which are disposed posts projecting from said surface
- whereby said assembly is installed within rotation with said posts being inserted into the slotted portions and said first tangs being deflected radially inward until said lip passes through the arcuate portions and the board is held between said surface and said shoulders; and
- said assembly is removed only through initial rotation with said second tangs being deformed radially inward upon rotation of said assembly until said shoulders are aligned with the slotted portions.

19. The assembly of claim 18 wherein said assembly is made of a plastic material.

20. The assembly of claim 18 wherein said first and second tangs are generally rectangular shaped having an inner curved surface generally conforming to the surface of the lamp.

21. The assembly of claim 18 wherein said lips include a cam surface opposite said shoulder for camming said first tangs inward upon insertion into the board.

22. The assembly of claim 18 wherein said first and second tangs have corners attached to said flange to assist in said first and second tangs deforming inwardly.

23. The assembly of claim 18 wherein said flange includes first slots therethrough adjacent said first tangs and second slots therethrough adjacent said second tangs to assist in said first and second tangs deforming inwardly.

24. The assembly of claim 18 further including opposed lock pads disposed between said adjacent posts.

25. The assembly of claim 24 wherein said lock pads include a contoured surface which passes under and lifts said surface away from the circuit board.

* * * * *

UNITED STATES PATENT AND TRADEMARK OFFICE
CERTIFICATE OF CORRECTION

PATENT NO. : 5,160,277
DATED      : November 3, 1992
INVENTOR(S): JAMES J. FITZGERALD and MARVIN L. OWEN It is certified that error appears in the above—identified patent and that said Letters Patent is hereby corrected as shown below:

Column 6, line 29, delete "2" and insert --1--.

Signed and Sealed this

Twenty-fifth Day of January, 1994

Attest:

BRUCE LEHMAN

*Attesting Officer*  *Commissioner of Patents and Trademarks*